United States Patent [19]
Iida et al.

[11] Patent Number: 4,679,216
[45] Date of Patent: Jul. 7, 1987

[54] SYNCHRONOUS BINARY COUNTER

[75] Inventors: Tetsuya Iida; Takayoshi Ikarashi, both of Yokohama, Japan

[73] Assignee: Kabushiki Kaisha Toshiba, Kawasaki, Japan

[21] Appl. No.: 894,210

[22] Filed: Aug. 7, 1986

[30] Foreign Application Priority Data

Aug. 19, 1985 [JP] Japan .................................. 60-181397

[51] Int. Cl.$^4$ ........................................... H03K 23/40
[52] U.S. Cl. .................................... 377/116; 377/111; 377/106
[58] Field of Search ............... 377/111, 115, 116, 118, 377/106

[56]  References Cited
U.S. PATENT DOCUMENTS

| 3,422,254 | 1/1969 | Lundin | 377/116 |
| 3,517,318 | 6/1970 | McDermond | 377/116 |
| 4,334,194 | 6/1982 | Rittenbach | 377/116 |

*Primary Examiner*—John S. Heyman
*Attorney, Agent, or Firm*—Finnegan, Henderson, Farabow, Garrett & Dunner

[57] ABSTRACT

A synchronous binary circuit comprising a counter including J-K flip-flops constituting lower l bit stages and higher m bit stages, first logic means for feeding, to J and K input terminals on each of flip-flops among the lower l bit stage flip-flops higher than the second bit stage, an AND of non-inverted outputs of all the lower stage flip-flops than the pertinent stage, second logic means for feeding, to the J and K input terminals of the first stage flip-flops among the higher m bit stage flip-flops, a first logical product of the non-inverted output of a one bit lower stage flip-flop and non-inverted outputs of the first to (l−1)-th bit stage flip-flops among the lower bit stage flip-flops, and third logic means for feeding, to the J and K input terminals of flip-flops among the higher m bit stage flip-flops higher than the second stage, a second logical product of non-inverted outputs of the lower first to (l−1)-th bit stage flip-flops and a third logical product, the third logical product being a logical product of an non-inverted output of a flip-flop lower by one bit than each of the flip-flops lower than the second stage and a fourth logical product, and the fourth logical product being a logical product of non-inverted outputs of flip-flops lower by more than two bit stages in the higher bit stage flip-flops.

9 Claims, 4 Drawing Figures

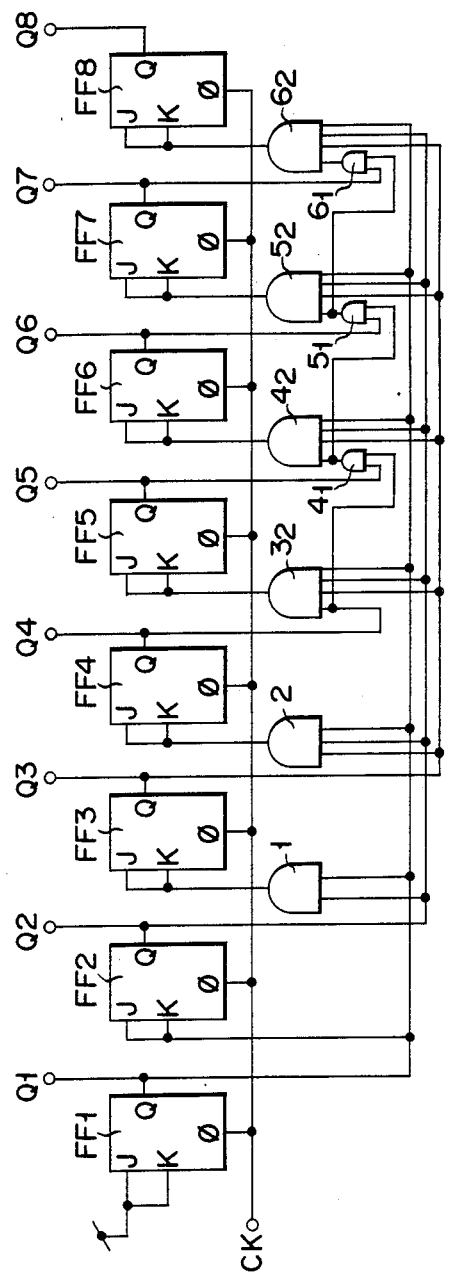
F I G. 3

SYNCHRONOUS BINARY COUNTER

BACKGROUND OF THE INVENTION

This invention relates to a synchronous binary counter in the form of a large scale integrated circuit for high speed digital signal processing.

The prior art synchronous binary counter has a construction as shown in FIG. 1. This construction has six bits constituted by respective J-K flip-flops FF1 to FF6. To the J and K terminals of each flip-flop are fed the AND of the positive outputs Q of all the lower bit flip-flops. To a clock input terminal of each flip-flop is fed clock pulse CK which is common to all the flip-flops. To the J and K terminals of the second highest bit, i.e., first stage, flip-flop is fed the positive output Q of the first stage. AND gates 31 to 34 are provided for the third to sixth stage flip-flops FF3 to FF6. AND gate 31 ANDs outputs of the bits lower than the third stage bit, i.e., outputs Q1 and Q2 of first and second stage flip-flops FF1 and FF2. It feeds an AND signal of the J and K input terminals of the third stage flip-flop FF3. Likewise, AND gate 32 ANDs the outputs of the bits lower than the fourth stage, i.e., outputs Q1 to Q3 of the first to third stage flip-flops FF1 to FF3, and it feeds the AND signal to the J and K input terminals of the fourth stage flip-flop FF4. Further, AND gate 33 ANDs the outputs of the lower bits than the fifth stage, i.e., outputs Q1 and Q4 of the first to fourth stage flip-flops FF1 to FF4, and it feeds the AND signal to the J and K input terminals of the fifth flip-flop FF5. Further, AND gate 34 ANDs the outputs of the lower bits than the last stage, i.e., outputs Q1 to Q5 of the first to fifth stage flip-flops FF1 to FF5, and it feeds the AND signal to the J and K input terminals of the last stage flip-flop FF6.

With the prior art synchronous binary counter as described above, the number of inputs to AND gates 31 to 34 is one more than the number of inputs for a stage that is higher by one bit, that is, the number of leads for the inputs is increased with increase of the order of the stage. Therefore, in the implementation of the integrated circuit, the input lead area is increased thus increasing the chip size and cost.

To cope with this problem, there has been proposed a construction as shown in FIG. 2. In this case, the inputs to the J and K input terminals of the third and higher stages are constituted by an AND of the input to the J and K input terminals and a positive output Q of one bit flip-flop from a lower stage, the AND signal being provided from each of AND gates 41 to 44, thus minimizing the input lead area for AND gates 41 to 44. With this construction, however, signal has to pass through all AND gates 41 to 44 until it reaches the J and K input terminals of the lowest order stage flip-flop FF1. This means that the operation speed of the counter is reduced.

SUMMARY OF THE INVENTION

The invention has been intended in light of the above circumstances, and its object is to provide a synchronous binary counter, which can minimize the input lead area for logic circuits for generating inputs to J and K input terminals of individual stage flip-flops without a substantial sacrifice in the operational speed.

According to the invention, there is provided a synchronous binary circuit comprising: a counter including J-K flip-flops constituting lower l bit stages and higher m bit stages, a common clock pulse being fed to a clock terminal of each of said flip-flops; first logic means for feeding, to J and K input terminals of each of flip-flops among said lower l bits stage flip-flops higher than the second bit stage, an AND of non-inverted outputs of all the lower stage flip-flops than the pertinent stage; second logic means for feeding, to the J and K input terminals of the first stage flip-flops among said higher m bit stage flip-flops, a first logical product of the non-inverted output of a one bit lower stage flip-flop and non-inverted outputs of the first to (l−1)-th bit stage flip-flops among said lower bit stage flip-flops; and third logic means for feeding, to the J and K input terminals of flip-flops among said higher m bit stage flip-flops higher than the second stage, a second logical product of non-inverted outputs of the lower first to (l−1)-th bit stage flip-flops and a third logical product, said third logical product being a logical product of an non-inverted output of a flip-flop lower by one bit than each of said flip-flops lower than the second stage and a fourth logical product, and said fourth logical product being a logical product of non-inverted outputs of flip-flops lower by more than two bit stages in said higher bit stage flip-flops.

BRIEF DESCRIPTION OF THE DRAWINGS

FIG. 3 is a schematic representation of one embodiment of a synchronous binary counter according to the invention.

DETAILED DESCRIPTION OF THE PREFERRED EMBODIMENTS

Figure 1:
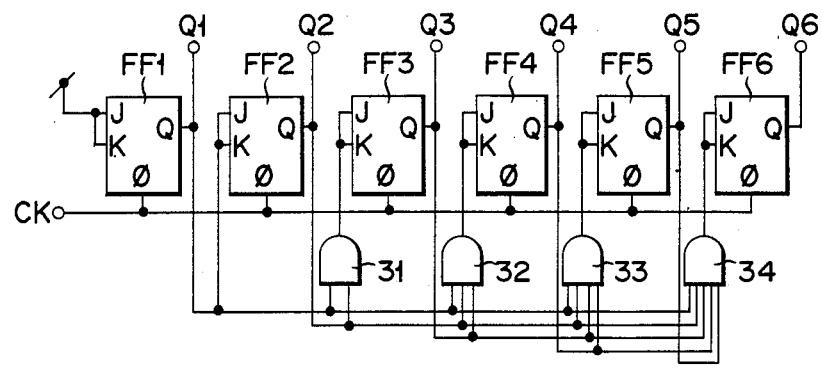
FIG. 1 is a schematic representation of a prior art synchronous binary counter.

Now, the preferred embodiments of a synchronous binary counter according to the invention will be described with reference to the accompanying drawings.

FIG. 3 shows a first embodiment of the invention. This embodiment of the synchronous binary counter has an 8-bit counter having eight J-K flip-flops FF1 to FF8. Each flip-flop has a J input terminal, a K input terminal, a clock terminal, and a Q output terminal. Flip-flops FF1 to FF8 correspond to the 1st to 8th bits, respectively.

The clock input terminals φ of all flip-flops FF1 to FF8 are connected together to receive a common clock pulse CK. The J and K input terminals of the first stage flip-flop FF1 among the lower four bit stages are held at a predetermined potential. The J and K input terminals of the second stage flip-flop FF2 are connected to the Q output terminal of the first stage flip-flop FF1, i.e., output signal Q1 of flip-flop FF1 is fed to these terminals. To the J and K input terminals of the third stage flip-flop FF3 is fed an output signal of AND gate 1, which ANDs the outputs of all the lower bit stages, i.e., output signals Q1 and Q2 of flip-flops FF1 and FF2. To the J and K input terminals of the fourth stage flip-flop FF4 is fed an output signal of AND gate 2, which, as in the case of the third stage flip-flop, ANDs the outputs of all the lower bit stages, i.e., output signals Q1 to Q3 of flip-flops FF1 to FF3.

Generally, of the four lower bit stages, to the J and K input terminals of each of the stages subsequent to the second stage is fed the AND of all the output signals of the lower bit stages.

Of the four upper bit stages, i.e., flip-flops FF5 to FF8, to the J and K input terminals of the first stage flip-flop FF5 is fed the output signal (i.e., AND output) of AND gate $3_2$, which AND s output signal Q4 of flip-flop FF4, the highest bit state among the lower stage side flip-flops, and output signals Q1 to Q3 of first to third stage flip-flops FF1 to FF3 among the lower stage side flip-flops. To the J and K input terminals of second stage flip-flop FF6 among the higher stage side flip-flops is fed an output signal (i.e., AND output) of AND gate $4_2$, which ANDs an output signal (i.e., AND output) of AND gate $4_1$ ANDing output signal Q5 of one bit lower stage flip-flop FF5 and output signal Q4 of one bit lower stage flip-flop FF4 than flip-flop FF5 and output signals Q1 to Q3 of first to third stage flip-flops FF1 to FF3 among the lower stage side flip-flops. To the J and K input terminals of third stage flip-flop FF7 among the higher stage side flip-flops is fed an AND output signal of AND gate $5_2$, which ANDs an AND output signal of AND gate $5_1$ ANDing the AND output of AND gate $4_1$ and output signal Q6 of flip-flop 6, i.e., ANDing output signals Q4 and Q5 of three and two bits lower stage flip-flops FF4 and FF5, and output signals Q1 to Q3 of first to third stage flip-flops FF1 to FF3 among the lower stage side flip-flops. To the J and K input terminals of fourth stage flip-flop FF8 among the higher stage side flip-flops is fed an AND output signal of AND gate $6_2$, which ANDs and AND output signal of AND gate $6_1$ ANDing an AND output of AND gate $5_1$ and output signal Q7 of flip-flop FF7, i.e., ANDing output signals Q4 and Q6 of four to two bits lower stage flip-flops FF4 to FF6, and output signals of first to third stage flip-flops FF1 to FF3 among the lower stage side flip-flops. Generally, to the J and K input terminals of each of the lower stage side flip-flops subsequent to the second stage is fed the AND of the AND output of the output signals of stage side flip-flops lower by two or more bits and output signal of the one bit lower stage flip-flop and all the output signals of the lower four stage side flip-flops except for the highest stage one, i.e., the output signals of first to third stage flip-flops FF1 to FF3.

Figure 2:
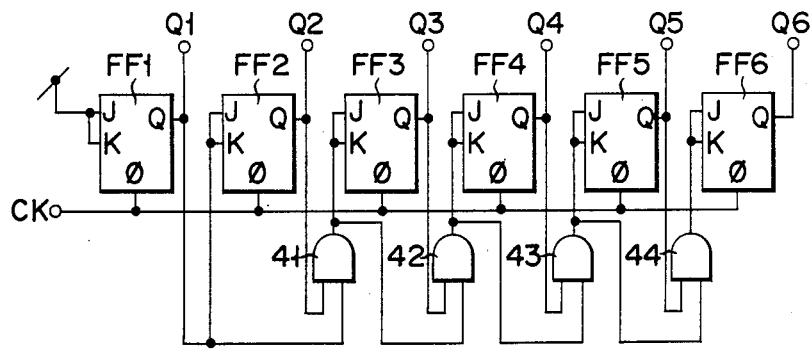
FIG. 2 is a schematic representation of another prior art synchronous binary counter.

In the binary counter having the above construction, the four lower stages each have the same circuit construction as the four lower stages of the prior art binary counter shown in FIG. 1. The four higher stages each have the same circuit construction as those shown in FIG. 1 except for that the prior art construction shown in FIG. 2 is incorporated in part of the input section of AND gates $3_2$ to $6_2$. In the synchronous binary counter of the above construction, all the eight stage flip-flops FF1 to FF8 are operated synchronously under control of the clock pulse. The circuit comprising the lower four stage flip-flops FF1 to FF4 is capable of high speed operation like the prior art circuit shown in FIG. 1. Further, the numbers of input leads to AND gates $4_2$ to $6_2$ are the same as those in the prior art construction shown in FIG. 1. Further, in the higher side stage flip-flops subsequent to the second upper stage, an AND of outputs of lower stage flip-flops by more than two bits is fed to the J and K input terminals. Therefore, the pertinent input lead number is smaller than in the case of the prior art circuit shown in FIG. 1. The circuit portion of the counter for the upper stage side has a slightly lower operational speed than the operation speed of the lower stage side. However, the difference in the operation speed is negligible for the entire counter circuit.

Figure 4:
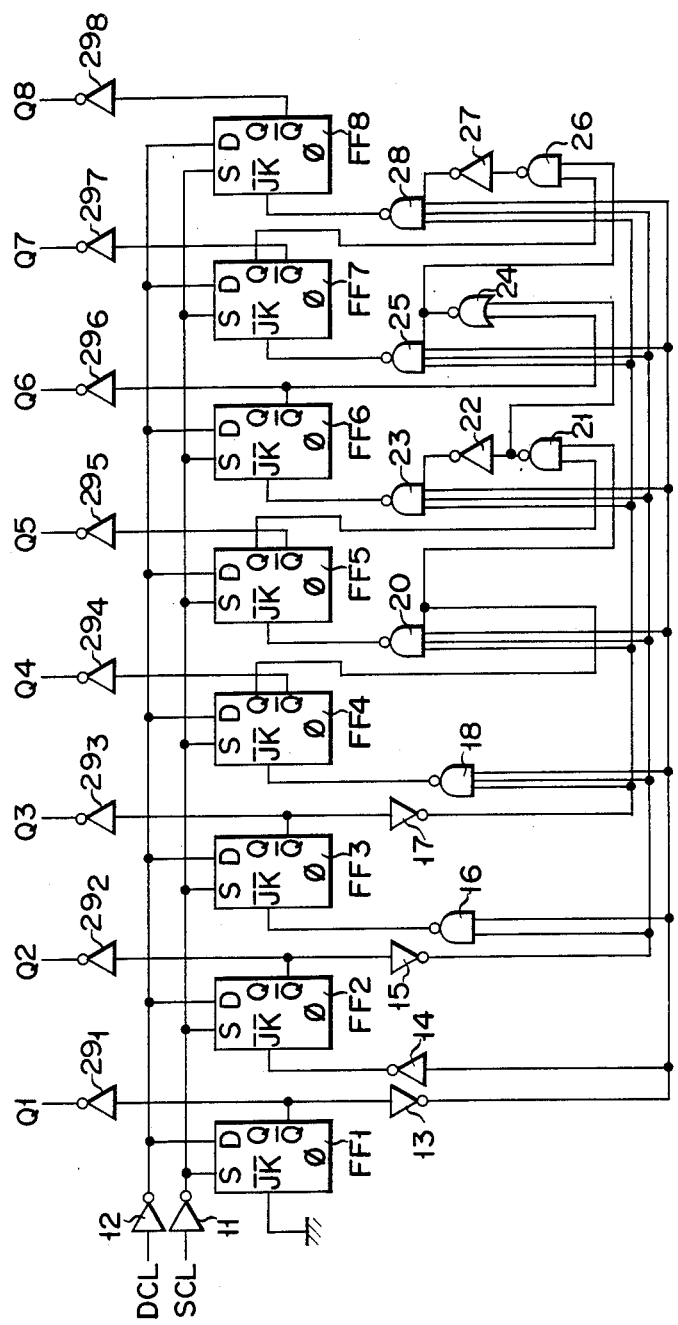
FIG. 4 is a schematic representation of another embodiment of a synchronous binary counter according to the invention.

FIG. 4 shows a second embodiment of the synchronous binary counter according to the invention. This embodiment comprises of J-K flip-flops FF1 to FF8 each having a $\overline{JK}$ input terminal, a $\phi$ clock pulse terminal, a synchronous clear terminal S, a direct clear terminal D, a Q output terminal and an $\overline{a}$ output terminal. Synchronous clear signal SCL is fed through inverter 11 to synchronous clear terminal S of each of flip-flops FF1 to FF8. Direct clear signal DCL is fed through inverter 12 to direct clear terminal D of each of flip-flops FF1 to FF8. Input terminal of first stage flip-flop FF1 is held at a predetermined potential. Inverted output signal $\overline{Q}$ of flip-flop FF1 is fed through inverter 12 as buffer to the higher stage flip-flops. The signal $\overline{Q}$ is passed through inverter 13 in order to prevent increase of fan-out. The output of inverter 3 is fed through inverter 14 to $\overline{JK}$ input terminal of second stage flip-flop FF2. The inverted output signal of flip-flop FF2 is fed through inverter 15 as buffer to the higher stage flip-flops. To $\overline{JK}$ input terminal of third stage flip-flop FF3 is fed a NAND output of NAND gate 16, which NANDs the outputs of inverters 13, 15, i.e., inversion signals Q obtained from output signals $\overline{Q}$ of lower stage flip-flops FF1 and FF2. Inverted output $\overline{Q}$ of flip-flop FF3 is inverted by inverter 17 as buffer. To $\overline{JK}$ input terminal of fourth stage flip-flop FF4 is fed a NAND output of NAND gate 18, which NANDs the outputs of inverters 13, 15 and 17, i.e., inversion signals Q obtained from inverted output signals $\overline{Q}$ of lower stage flip-flops FF1 to FF3. To $\overline{JK}$ input terminal of fifth stage flip-flop FF5 is fed a NAND output of NAND gate 20, which NANDs non-inverted output of one bit lower stage flip-flop FF4 and outputs of inverters 13, 15 and 17, i.e., inversion signals Q obtained from inverted outputs Q of first to third stage flip-flops FF1 to FF3. To $\overline{JK}$ input terminal of sixth stage flip-flop FF6 is fed a NAND output of NAND gate 23, which NANDs an output of inverter 22 inverting a NAND output of NAND gate 21 NANDing non-inverted outputs Q of fourth and fifth stage flip-flops FF4 and FF5 and outputs of inverters 13, 15, and 17, i.e., inversion signals Q obtained from output signals of first to third stage flip-flops FF1 to FF3. To $\overline{JK}$ input terminal of seventh stage flip-flop FF7 is fed a NAND output of NAND gate 25, which NANDs a NOR output of NOR gate 24 NORing inverted output $\overline{Q}$ of sixth stage flip-flop FF6 and NAND output of NAND gate 21 for the sixth stage and outputs of inverters 13, 15, and 17, i.e., inversion outputs Q obtained from inverted output signals $\overline{Q}$ of first to third stage flip-flops FF1 to FF3. To $\overline{JK}$ input terminal of last stage flip-flop FF8 is fed a NAND out of a NAND gate 28, which ANDs an output of inverter 27 inverting a NAND output NAND gate 26 NANDing non-inverted output Q of seventh stage flip-flop FF7 and the NAND output of NAND gate 24 for the seventh stage flip-flop FF7 and outputs of inverters 13, 15, and 17, i.e., inversion signals Q obtained from inverted output signals $\overline{Q}$ of first to third stage flip-flops FF1 to FF3. Inverted outputs $\overline{Q}$ of flip-flops FF1 to FF8 are inverted through inverters $29_1$ to $29_8$ to recover non-inverted outputs Q1 to Q8.

With the binary counter of the above construction, the numbers of input leads to the logic circuits for generating $\overline{JK}$ inputs to be fed to the $\overline{JK}$ input terminals of the higher stage side flip-flops are reduced. Besides, this can be attained only with a slight reduction of the operational speed.

As has been described in the foregoing, with the synchronous binary counter according to the invention it is possible to minimize the input lead areas for the J and K input generation logic circuits for the individual stages without a substantial sacrifice in reducing the operational speed. Thus, the synchronous binary counter according to the invention is suited for the formation of an integrated circuit for high speed digital signal processing.

What is claimed is:

1. A synchronous binary counter comprising:
a counter including J-K flip-flops constituting lower l bit stages and higher m bit stages, a common clock pulse being fed to a clock terminal of each of said flip-flops;
first logic means for feeding, to J and K input terminals of each of flip-flops among said lower l bit stage flip-flops higher than the second bit stage, an AND of non-inverted outputs of all the lower stage flip-flops than the pertinent stage;
second logic means for feeding, to the J and K input terminals of the first stage flip-flops among said higher m bit stage flip-flops, a first logical product of the non-inverted output of a one bit lower stage flip-flop and non-inverted outputs of the first to (l−1)-th bit stage flip-flops among said lower bit stage flip-flops; and
third logic means for feeding, to the J and K input terminals of flip-flops among said higher m bit stage flip-flops higher than the second stage, a second logical product of non-inverted outputs of the lower first to (l−1)-th bit stage flip-flops and a third logical product, said third logical product being a logical product of an non-inverted output of a flip-flop lower by one bit than each of said flip-flops lower than the second stage and a fourth logical product, and said fourth logical product being a logical product of non-inverted outputs of flip-flops lower by more than two bit stages in said higher bit stage flip-flops.

2. The synchronous binary counter according to claim 1, wherein said individual bit stages each include means for inverting the inverted output of each stage flip-flop to provide a non-inverted output.

3. The synchronous binary counter according to claim 1, wherein said l and m are both 4, and said third logic circuit includes first, second and third input means for feeding said last recited AND to the second, third and fourth bit stage flip-flops among said higher four bit stage flip-flops.

4. The synchronous binary counter according to claim 3, wherein said first input means includes a first NAND gate for ANDing a non-inverted output of the highest bit stage flip-flop among said lower bit stage flip-flops and a non-inverted output of the first bit stage flip-flop among said higher bit stage flip-flops and a second AND gate for ANDing the AND output of said first AND gate and non-inverted outputs of the first to third bit stage flip-flops among said lower bit stage flip-flops and feeding the resultant AND output to the J and K input terminals of the second bit stage flip-flops among said higher bit stage flip-flops.

5. The synchronous binary counter according to claim 4, wherein said second input means includes a third AND gate for ANDing the AND output of said first AND gate and a fourth AND gate for ANDing the AND output of said third AND gate and non-inverted outputs of the first to third bit stage flip-flops among said lower bit stage flip-flops and feeding the resultant AND output to the J and K input terminals of the third bit stage flip-flop among said upper bit stage flip-flops.

6. The synchronous binary counter according to claim 5, wherein said third input means includes a fifth AND gate for ANDing the AND output of said third AND gate and the non-inverted output of said third bit stage flip-flop among said higher bit stage flip-flops and a sixth AND gate for ANDing the AND output of said fifth AND gate and the non-inverted outputs of the first to third flip-flops among said lower bit stage flip-flops and feeding the resultant AND output to the J and K input terminals of the fourth bit stage flip-flop among said higher bit stage flip-flops.

7. The synchronous binary counter according to claim 3, wherein said first input means includes a first NAND gate for NANDing the non-inverted output of the highest bit stage flip-flop among said lower bit stage flip-flops, an inverter for inverting the level of the NAND output of said NAND gate and a second NAND gate for NANDing the output of said inverter and the non-inverted output of the first to third bit stage flip-flops among said lower bit stage flip-flops and feeding the resultant NAND output to the J and K input terminals of the second bit stage flip-flop among said higher bit stage flip-flops.

8. The synchronous binary counter according to claim 1, wherein said second input means includes a NOR gate for NORing the NAND output of said first NAND gate and the inverted output of the second bit stage flip-flop among said higher bit stage flip-flops, and a third NAND gate for NANDing the NOR output of said NOR gate and the non-inverted outputs of the first to third bit stage flip-flops among said lower bit stage flip-flops and feeding the resultant NAND output to the J and K input terminals of the third bit stage flip-flop among said higher bit stage flip-flops.

9. The synchronous binary counter according to claim 8, wherein said third input means includes a fourth NAND gate for NANDing the NOR output of said NOR gate and the non-inverted output of said third bit stage flip-flop among said higher bit stage flip-flops, an inverter for inverting the level of the output of said fourth NAND gate, and a fifth NAND gate for NANDing the output of said inverter and the non-inverted outputs of the first to third bit stage flip-flops among said lower bit stage flip-flops and feeding the resultant NAND output to the J and K input terminals of the fourth bit stage flip-flop among said higher bit stage flip-flops.

* * * * *